(12) United States Patent
Rao et al.

(10) Patent No.: US 8,498,169 B2
(45) Date of Patent: Jul. 30, 2013

(54) CODE-BASED DIFFERENTIAL CHARGING OF BIT LINES OF A SENSE AMPLIFIER

(75) Inventors: Hari M. Rao, San Diego, CA (US); Esin Terzioglu, San Diego, CA (US); Sei Seung Yoon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 73 days.

(21) Appl. No.: 13/224,562

(22) Filed: Sep. 2, 2011

(65) Prior Publication Data
US 2013/0058172 A1 Mar. 7, 2013

(51) Int. Cl.
*G11C 29/00* (2006.01)
*G11C 16/28* (2006.01)

(52) U.S. Cl.
CPC .................................... *G11C 16/28* (2013.01)
USPC ...... 365/201; 365/189.05; 365/196; 365/207; 365/202; 365/204

(58) Field of Classification Search
CPC ...................................................... G11C 16/28
USPC .................... 365/201, 189.05, 196, 207, 202, 365/204
See application file for complete search history.

(56) References Cited

U.S. PATENT DOCUMENTS

| | | | |
|---|---|---|---|
| 6,229,745 B1 | 5/2001 | Nambu et al. | |
| 6,314,039 B1 | 11/2001 | Hill et al. | |
| 6,711,068 B2 | 3/2004 | Subramanian et al. | |
| 7,020,035 B1 | 3/2006 | Eleyan et al. | |
| 7,505,346 B2 * | 3/2009 | Kobayashi | 365/207 |
| 2007/0145981 A1 | 6/2007 | Tomita et al. | |
| 2010/0067318 A1 | 3/2010 | Senou | |
| 2011/0019493 A1 | 1/2011 | Ikeda et al. | |

OTHER PUBLICATIONS

International Search Report and Written Opinion—PCT/US2012/053686—ISA/EPO—Jan. 17, 2013.

\* cited by examiner

*Primary Examiner* — Thong Q Le
(74) *Attorney, Agent, or Firm* — Sam Talpalatsky; Nicholas J. Pauley; Joseph Agusta

(57) ABSTRACT

A circuit includes a plurality of capacitors responsive to a plurality of latches that store a test code. A first bit line is coupled to a bit cell and coupled to a sense amplifier. A second bit line is coupled to the bit cell and coupled to the sense amplifier. A differential charge from a set of the plurality of capacitors is applied to the first bit line and to the second bit line. The set of the plurality of capacitors is determined based on the test code and the test code is independent of an output of the sense amplifier.

42 Claims, 8 Drawing Sheets

CODE-BASED DIFFERENTIAL CHARGING OF BIT LINES OF A SENSE AMPLIFIER

I. FIELD

The present disclosure is generally related to characterization of and compensation for sense amplifier voltage offset.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. These wireless telephones may also include memory devices, such as a static random access memory (SRAM). As such, these wireless telephones can include significant computing capabilities.

An SRAM typically has multiple bit cells that are coupled to a sense amplifier via a first bit line and a second bit line. During a read operation on a bit cell, a voltage difference between the first bit line and the second bit line triggers the sense amplifier to generate an output representing a value stored in the bit cell. The amount of voltage difference between the first bit line and the second bit line that would trigger the sense amplifier may include a component (voltage offset) that is a result of imbalance in the sense amplifier. Sense amplifier imbalance may be caused by variations in physical layout of the sense amplifier, variations in the characteristics of transistors that make up the sense amplifier, variations in supply voltages, one or more other factors, or a combination thereof. Voltage offset caused by the sense amplifier imbalance is undesirable and may cause additional delay in reading a bit cell. This additional delay ultimately impacts the read throughput of the SRAM. In addition, voltage offset caused by the sense amplifier imbalance may impede accurate characterization of bit cells.

III. SUMMARY

A characterization and offset compensation circuit may include capacitors that are controllable to introduce a voltage difference between a first bit line and a second bit line that are coupled to a sense amplifier. The characterization and offset compensation circuit may also include latches that are coupled to the capacitors. Test code loaded into the latches selects a first group of the capacitors to be coupled to the sense amplifier via the first bit line and a second group of the capacitors to be coupled to the sense amplifier via the second bit line. By selecting the capacitors that are coupled to the sense amplifier, a voltage difference between the first bit line and the second bit line may be introduced. A sweep through different test codes may be performed until the sense amplifier output toggles as a result of the voltage difference applied between the first bit line and the second bit line. The particular test code that results in the toggling of the sense amplifier output (or other test code derived from the particular test code) may be stored for use during a functional read operation.

In a particular embodiment, a circuit includes a plurality of capacitors responsive to a plurality of latches that store a test code. A first bit line is coupled to a bit cell and coupled to a sense amplifier, and a second bit line is coupled to the bit cell and coupled to the sense amplifier. A differential charge from a set of the plurality of capacitors is applied to the first bit line and to the second bit line. The set of the plurality of capacitors is determined based on the test code. The test code is independent of an output of the sense amplifier.

In another particular embodiment, a method includes providing a test code to a plurality of latches that are coupled to a plurality of capacitors. The method also includes applying a differential charge from a set of the plurality of capacitors to a first bit line and to a second bit line that are coupled to a sense amplifier. The set of the plurality of capacitors is determined based on the test code. The test code is independent of an output of the sense amplifier.

In particular embodiment, an apparatus includes a plurality of capacitors responsive to a plurality of latches. The apparatus also includes an offset compensation code storage configured to provide an offset compensation code to be loaded into the plurality of latches. A first bit line is coupled to a sense amplifier, and a second bit line is coupled to the sense amplifier. A differential charge from a set of the plurality of capacitors is applied to the first bit line and to the second bit line during a memory operation to compensate for a measured offset of the sense amplifier. The set of the plurality of capacitors is determined based on the offset compensation code that is loaded into the plurality of latches from the offset compensation code storage.

In another particular embodiment, a method includes loading an offset compensation code into a plurality of latches that are coupled to a plurality of capacitors. The method also includes applying a differential charge from a set of the plurality of capacitors to a first bit line and to a second bit line that are coupled to a sense amplifier. The differential charge is applied during a memory operation to compensate for a previously measured offset of the sense amplifier. The set of the plurality of capacitors is determined based on the offset compensation code that is loaded from an offset compensation code storage.

One particular advantage provided by at least one of the disclosed embodiments is application of a differential charge that compensates or at least partially compensates for a voltage offset of a sense amplifier. Compensation for a sense amplifier offset voltage may enable increased frequency of read operations on bit cells that may result in higher memory read throughput. Further, characterization of a sense amplifier may enable improved characterization of bit cells by reducing impact of the sense amplifier in bit cell characterization information.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
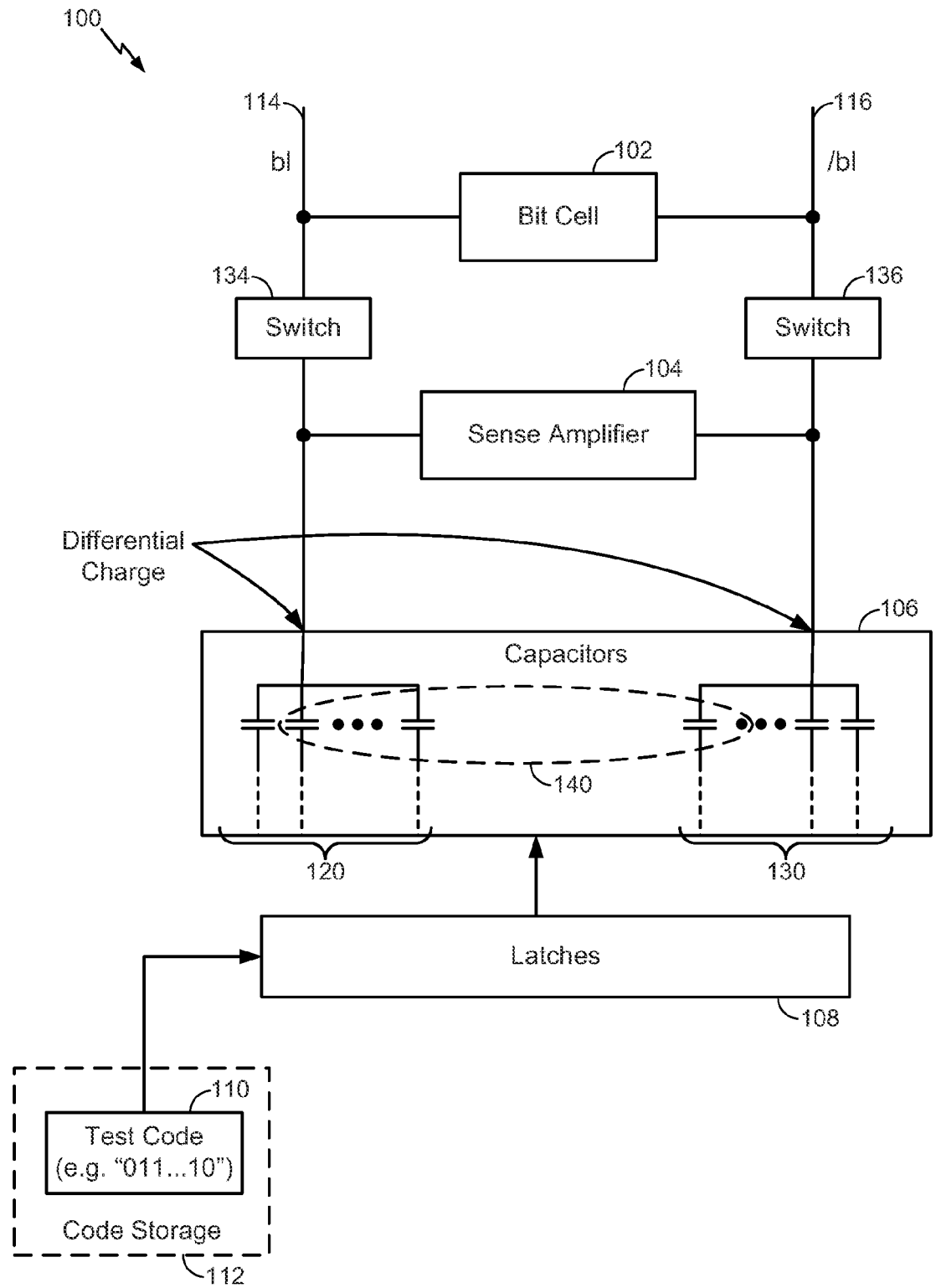
FIG. 1 is a block diagram of a particular illustrative embodiment of a circuit operable to characterize a sense amplifier, to characterize a bit cell, and to substantially compensate for a voltage offset of a sense amplifier.

Referring to FIG. 1, a particular illustrative embodiment of a circuit that is operable to characterize a sense amplifier, to characterize a bit cell, and to substantially compensate for a voltage offset of a sense amplifier is depicted and generally designated 100. The circuit 100 includes a bit cell 102 that is selectively coupled to a sense amplifier 104 via a first switch 134 on a first bit line (bl) 114 and via a second switch 136 on a second bit line (/bl) 116. The first bit line 114 and the second bit line 116 are each coupled to a plurality of capacitors 106. The plurality of capacitors 106 is responsive to a plurality of latches 108. The plurality of latches 108 is configured to store a test code 110 that may be loaded from a code storage 112.

In a particular embodiment, the bit cell 102 is configured to store a data value. For example, the bit cell 102 may be a 6-transistor static random access memory (6T SRAM) cell. During read operations, the bit cell 102 is configured to apply a first voltage to the first bit line 114 and to apply a second voltage to the second bit line 116. The first voltage and the second voltage (or a difference between the first voltage and the second voltage) may indicate a data value stored at the bit cell 102. A speed of the bit cell 102 in applying the first voltage and the second voltage to the first and second bit lines 114, 116 may depend on a characteristic of the bit cell 102.

In a particular embodiment, the sense amplifier 104 is configured to generate an output value indicative of a voltage difference detected by the sense amplifier 104 between the first bit line 114 and the second bit line 116. For example, the voltage difference between the first bit line 114 and the second bit line 116 may be indicative of a data value stored at the bit cell 102. To illustrate, the first bit line 114 and the second bit line 116 may be precharged and one of the first bit line 114 and the second bit line 116 is discharged via the bit cell 102 while the other one of the first bit line 114 and the second bit line 116 remains charged. The sense amplifier 104 may be triggered by an increase in the voltage difference between the first bit line 114 and the second bit line 116 as the bit line 114 or the bit line 116 discharges. A first voltage difference between the first bit line 114 and the second bit line 116 may indicate a first bit value and a second voltage difference between the first bit line 114 and the second bit line 116 may indicate a second bit value that is different from the first bit value.

The speed of detecting a voltage difference between the first bit line 114 and the second bit line 116 may be affected by a voltage offset of the sense amplifier 104 (sense amplifier voltage offset). The sense amplifier voltage offset may be a result of, for example, manufacturing process variations between components that make up the sense amplifier 104, such as transistors that form a latch within the sense amplifier 104. In order for the sense amplifier 104 to detect a voltage difference between the first bit line 114 and the second bit line 116, the voltage difference may need to exceed the voltage offset of the sense amplifier 104, which may cause delay in detecting the voltage difference. Because a sense amplifier voltage offset may delay detection of a voltage difference between the first bit line 114 and the second bit line 116, the speed of the sense amplifier 104 in generating an output (e.g. a read data bit value of the bit cell 102) indicative of a voltage difference detected between the first bit line 114 and the second bit line 116 may also be delayed.

In a particular embodiment, the plurality of capacitors 106 includes a first group of capacitors 120 that may be coupled to the first bit line 114 and a second group of capacitors 130 that may be coupled to the second bit line 116. Capacitors of the plurality of capacitors 106 may be metal-oxide-semiconductor (MOS) capacitors. For example, the capacitors of the plurality of capacitors 106 may be n-channel MOS (NMOS) capacitors. Alternatively, or in addition, the plurality of capacitors 106 may include other types of reactance elements. Individual capacitors of the first group and second group of capacitors 120, 130 (e.g., a set 140 of the plurality of capacitors 106) may be selectively charged based on values stored in the plurality of latches 108. In alternative embodiments, the first group and second group of capacitors 120, 130 may be selectively coupled to the first and second bit lines 114, 116 and charged based on values stored in the plurality of latches 108. The set of the plurality of capacitors is determined based on the test code 110. The set 140 of the plurality of capacitors 106 may include all or a subset of capacitors in the plurality of capacitors 106. A differential charge from the set 140 of the plurality of capacitors 106 may be applied to the first bit line 114 and the second bit line 116. In a particular embodiment, the set 140 of the plurality of capacitors 106 may apply a differential charge to the first and second bit lines 114, 116 to substantially compensate for a voltage offset of the sense amplifier 104. For example, the differential charge from the set 140 of the plurality of capacitors 106 may be applied to the first bit line 114 and to the second bit line 116 during a memory operation. The memory operation may be a functional mode read operation. In alternative embodiments, the memory operation may be a test mode read operation.

In a particular embodiment, the plurality of latches 108 is configured to receive the test code 110 and to latch the test code 110. The test code 110 may be provided to the plurality of latches 108. For example, the test code 110 may be provided to the plurality of latches 108 by serially shifting the test code 110 into the plurality of latches 108. To illustrate, the test code 110 may be provided to the plurality of latches 108 via a scan input. The plurality of latches 108 is coupled to the plurality of capacitors 106 and enables selective charging of individual capacitors of the plurality of capacitors 106 based on the test code 110 that is provided to the plurality of latches 108. For example, the test code 110 may include one values and zero values. Each one value stored in an individual latch of the plurality of latches 108 may trigger charging of one or more capacitors of the plurality of capacitors 106. In this manner, individual capacitors of the plurality of capacitors 106 may be selectively charged according to the test code 110 that is loaded into the plurality of latches 108. The test code 110 may be independent of an output of the sense amplifier 104. For example, the test code 110 may be generated or stored prior to a memory operation.

In a particular embodiment, the circuit 100 may optionally include the code storage 112. For example, the code storage 112 may be a register or other memory structure that may be located on a same semiconductor die as the plurality of latches 108 or may be located on another die. In another particular embodiment, the code storage 112 may be located in test equipment, such as a signal generator.

During operation, the switches 134, 136 (e.g. column selection transistors or other switching devices) may be controlled to electrically isolate the bit cell 102 from the sense amplifier 104. The portion of the first bit line 114 and the second bit line 116 coupled to the sense amplifier 104 may be precharged to a precharge voltage. The test code 110 may be loaded into the plurality of latches 108 to enable charging of each capacitor in the set 140 of the plurality of capacitors 106. The set 140 of the plurality of capacitors 106 may apply a differential charge to the first bit line 114 and to the second bit line 116. For example, the differential charge applied to the first bit line 114 and to the second bit line 116 may correspond to the particular test code 110 that is loaded into the plurality of latches 108. The output of the sense amplifier 104 may toggle indicating a change of state of the sense amplifier 104. If the output of the sense amplifier 104 toggles as a result of the differential charge applied to the first bit line 114 and to the second bit line 116 during a characterization of the sense amplifier 104, the differential charge may correspond to a voltage that substantially compensates for the voltage offset of the sense amplifier 104. If the output of the sense amplifier does not toggle in response to the differential charge applied during a characterization of the sense amplifier 104, the differential charge may correspond to a voltage that does not substantially compensate for the voltage offset of the sense amplifier 104. The operation may be repeated with different values of the test code 110 that results in a different differential charge being applied to the first and second bit lines 114, 116 until a differential charge that results in sense amplifier toggle is detected.

To illustrate, a sweep operation may be performed by sequentially loading a series of test codes that correspond to different differential charges that are applied to the first and second bit lines 114, 116. The differential charges may correspond to voltages on the first and second bit lines 114, 116. Each test code in the series of test codes may be independent of an output of the sense amplifier 104. For example, each test code (e.g., the test code 110) in the series of test codes may be generated according to a sweep operation and independent of a memory operation, such as a memory read operation on the bit cell 102. The test code 110 may be programmable to enable the sweep operation. For example, the sweep operation may include a series of test codes that correspond to incrementing differential charges that are applied to the first and second bit lines 114, 116. Alternatively, the sweep operation may include a series of test codes that correspond to decrementing differential charges that are applied to the first and second bit lines 114, 116.

During a sweep operation, the sense amplifier 104 may be monitored to determine whether the sense amplifier 104 changes state in response to a change in the test code 110. For example, an output of the sense amplifier 104 may be monitored to determine an effect of a particular test code on the sense amplifier 104. Conducting a sweep operation may also include recording the test code 110 in response to the sense amplifier 104 changing state. In a particular embodiment, the sweep operation may continue with adjustment of the differential charge applied to the first and second bit lines 114, 116 until an output of the sense amplifier 104 changes state. For example, the sweep operation may continue until an output of the sense amplifier 104 changes from a high state to a low state in response to a particular test code 110 that is loaded into the plurality of latches 108.

In response to a change in the output of the sense amplifier 104, the particular test code 110 that resulted in the sense amplifier 104 changing state may be stored as an offset compensation code at the code storage 112 or at another storage (e.g., an offset compensation code storage of FIG. 2) for later use, such as for use in subsequent memory operations. Alternatively, the particular test code 110 that resulted in the sense amplifier 104 changing state may remain in the code storage 112 and flagged accordingly. In another particular embodiment, a sweep operation may also include recording the test code 110 in response to the sense amplifier 104 not changing state. In a particular embodiment, the sweep operation may be conducted with the sense amplifier 104 isolated from the bit cell 102 in order to characterize the sense amplifier 104. In an alternative embodiment, the sweep operation may be conducted with the sense amplifier 104 electrically coupled to the bit cell 102 in order to characterize the bit cell 102.

After characterizing the sense amplifier 104, the switches 134, 136 may be controlled to enable the sense amplifier 104 to read a value stored in the bit cell 102. The particular test code 110 that resulted in the output of the sense amplifier 104 changing state (or another test code derived from the particular test code 110) may be loaded into the plurality of latches 108 to substantially compensate for the sense amplifier voltage offset. For example, the circuit 100 may be switched to another operational mode, such as from a test mode to a functional mode. During a particular operation mode, the particular test code 110 that is loaded into the plurality of latches 108 may be used to substantially compensate for the sense amplifier voltage offset without being affected or changed by the output of the sense amplifier 104. As a result, the particular test code 110 may be independent of an output of the sense amplifier 104.

By loading a series of test codes 110 into the plurality of latches 108 and monitoring an output of the sense amplifier 104, an amount of capacitance that is effective in applying a sufficient amount of differential charge that may substantially compensate for a voltage offset of the sense amplifier may be determined. The test code 110 that is determined to correspond to a differential charge that substantially compensates for the voltage offset of the sense amplifier 104 may be loaded into the latches 108 during subsequent memory read operations of bit cells that are coupled to the sense amplifier 104, such as a read operation of data stored at the bit cell 102. Alternatively, another test code that is derived from the test code 110 that is determined to correspond to a differential charge that substantially compensates for the voltage offset of the sense amplifier 104 may be loaded into the latches 108 during subsequent memory read operations. For example, another test code may be derived by incrementing or decrementing the test code 110 that is determined to correspond to a differential charge that substantially compensates for the voltage offset of the sense amplifier 104. As a result of characterizing the sense amplifier and determining the test code 110 that corresponds to a differential charge that results in a voltage that substantially compensates for the voltage offset of the sense amplifier 104, read operations may be performed at an increased speed by reducing the time the sense amplifier 104 may need to detect a voltage difference between the first and the second bit lines 114, 116. Similarly, by determining an amount of charge the bit cell 102 can overcome and accounting for a voltage offset of the sense amplifier 104, improved characterization of bit cells, such as the bit cell 102, may be performed. A The circuit 100 enables processing requirements to be reduced because an operation of the sense amplifier 104 may be tuned after fabrication by determining an effective test code 110 to substantially compensate for a voltage offset of the sense amplifier 110. In addition, the speed of read operations is improved by substantially compensating for the voltage offset of the sense amplifier 104. Further, manufacturing processes may be improved based on improved characterization of bit cells.

Figure 2:
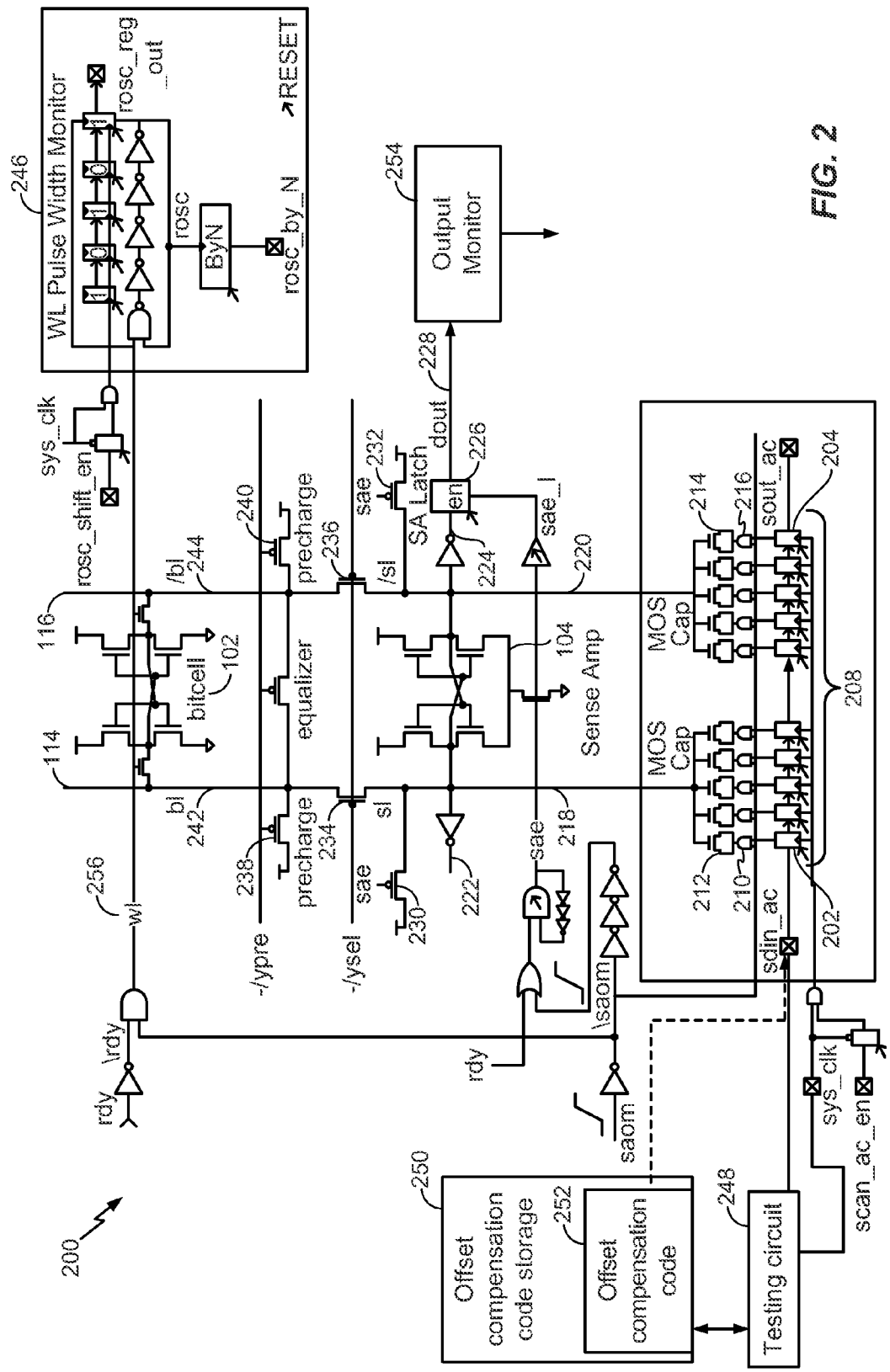
FIG. 2 is a circuit diagram of a particular illustrative embodiment of the circuit of FIG. 1.

Referring to FIG. 2, a particular embodiment of a circuit that is operable to characterize a sense amplifier, to characterize a bit cell, and to substantially compensate for a voltage offset of a sense amplifier is depicted and generally designated 200. In a particular embodiment, the circuit 200 corresponds to the circuit 100 of FIG. 1 and includes the bit cell 102 and the sense amplifier 104 that are each coupled to the first bit line 114 and the second bit line 116. The first bit line 114 includes a first segment 218 that is coupled to a first group of capacitors 212 and also includes a second segment 242 that is coupled to the bit cell 102. The second bit line 116 includes a first segment 220 that is coupled to a second group of capacitors 214 and also includes a second segment 244 that is coupled to the bit cell 102. The first segment 218 and the second segment 242 of the first bit line 114 may be selectively coupled or decoupled by operation of a first decoupling device 234, such as a column selection transistor. The first segment 220 and the second segment 244 of the second bit line 116 may be selectively coupled or decoupled by operation of a second decoupling device 236, such as a column selection transistor.

A first output 222 and a second output 224 provide output signals representative of a voltage difference between the first bit line 114 and the second bit line 116 detected by the sense amplifier 104. The second output 224 is coupled to an input of a sense amplifier latch 226. An output 228 of the sense amplifier latch 226 is provided to an output monitor 254. A first bit line precharge device 238 is coupled to the second segment 242 of the first bit line 114 and a second bit line precharge device 240 is coupled to the second segment 244 of the second bit line 116. A first sense line precharge device 230 is coupled to the first segment 218 of the first bit line 114 and a second sense line precharge device 232 is coupled to the first segment 220 of the first bit line 116. The first group of capacitors 212 is coupled to a first group of logic gates 210 that are responsive to a values stored in a first group of latches 202 of a plurality of latches 208. The second group of capacitors 214 is responsive to a second group of logic elements 216 that are responsive to values stored in a second group of latches 204 of the plurality of latches 208. In a particular embodiment, the plurality of latches 208 form a shift register. A testing circuit 248 may be coupled to an input of the plurality of latches 208. An offset compensation code storage 250 may be coupled to the plurality of latches 208 to provide an offset compensation code 252 to the plurality of latches 208. The offset compensation code storage 250 may also receive a test code, such as an offset adjustment code 252, from the plurality of latches 208. A word line pulse width monitor 246 is coupled to receive a word select signal (wl) 256 that is coupled to activate the bit cell 102.

The first decoupling device 234 is configured to selectively couple or decouple the first segment 218 from the second segment 242 of the first bit line 114. For example, the first decoupling device 234 may decouple the first segment 218 from the second segment 242 to enable a characterization of the sense amplifier 104. The precharge device 230 may be enabled to apply a precharge voltage to the first segment 218 of the first bit line 114 without applying the precharge voltage to the second segment 242 of the first bit line 114. Similarly, the second decoupling device 236 may be configured to decouple the first segment 220 of the second bit line 116 from the second segment 244 of the second bit line 116. The second precharge device 232 may be enabled to apply a precharge voltage to the first segment 220 without applying the precharge voltage to the second segment 244. Similarly, when the first segments 218, 220 are decoupled from the second segments 242, 244, the second segments 242, 244 may be precharged by operation of the first bit line precharge device 238 and the second bit line precharge device 240, respectively.

In a particular embodiment, the testing circuit 248 is configured to provide multiple test codes to the plurality of latches 208 during a characterization process to determine a test code that substantially compensates for a voltage offset of the sense amplifier 104. For example, the testing circuit 248 is configured to provide a series of test codes to the plurality of latches 208 to determine a characteristic of the sense amplifier 104. The series of test codes may be independent of an output of the sense amplifier 104. To illustrate, the testing circuit 248 may include a table of multiple test codes that are independent of an output of the sense amplifier 104 and that may be selectively and sequentially provided to the plurality of latches 208. For example, the testing circuit 248 may have access to code storage or may include code storage, (such as the code storage 112 of FIG. 1 or 250 of FIG. 2). In an alternative embodiment, the testing circuit 248 may include a counter or other logic configured to generate a series of test codes without storing the test codes at a code storage.

The testing circuit 248 is further configured to determine a test code, such as the test code 110 of FIG. 1, that substantially compensates for a voltage offset of the sense amplifier 104. The testing circuit 248 may operate in conjunction with the output monitor 254 to determine a test code that substantially compensates for a voltage offset of the sense amplifier 104. After determining a particular test code that substantially compensates for a voltage offset of the sense amplifier 104, the testing circuit 248 may provide the particular test code to the offset compensation code storage 250 to be stored as the offset compensation code 252. In a particular embodiment, the offset compensation code storage 250 may be the same as the code storage 110 of FIG. 1 or another storage (not shown). A voltage resulting from a differential charge applied to the first and second bit lines 114, 116 may correspond to the offset compensation code 252 and may be a measured offset of the sense amplifier 104. The testing circuit 248 may be included in the same semiconductor die as the plurality of latches 108 or may be located on another die. In alternative embodiments, the testing circuit 248 may be located in test equipment, such as a signal generator.

In a particular embodiment, the offset compensation code storage 250 is configured to store the offset compensation code 252 that may substantially compensate for a voltage offset of the sense amplifier 104. For example, the offset compensation code storage 250 may be configured to receive the offset compensation code 252 from the testing circuit 248. In a particular embodiment, the offset compensation code storage 250 may be configured to provide the offset compensation code 252 to be loaded into the plurality of latches 208. The offset compensation code 252 may be the same test code that is determined by the testing circuit 248 to substantially compensate for a voltage offset of the sense amplifier 104. Alternatively, the offset compensation code 252 may be derived from a test code that is determined by the testing circuit 248 to substantially compensate for a voltage offset of the sense amplifier 104. The offset compensation code 252 may be stored in the offset compensation code storage 250 to be provided to the plurality of latches 208 to substantially compensate for the voltage offset of the sense amplifier 104 during a memory read operation of the bit cell 102. In a particular embodiment, the offset compensation code storage 250 may be a register or other volatile memory, or a nonvolatile memory such as a fuse array.

In a particular embodiment, the word line pulse width monitor 246 is configured to provide outputs (rosc_reg_out and rocs_by_N) that may be used to determine a pulse width of the word select signal (wl). The word line pulse width monitor 246 may include a ring oscillator formed from multiple inverters. The word line pulse width monitor 246 also includes multiple latches coupled to an output of each of the inverters. The word line pulse width monitor 246 is configured to provide outputs (rosc_reg_out and rocs_by_N) that may be used to determine a pulse width of a word select signal (wl). The ring oscillator is coupled to a divider that divides a frequency of a ring oscillator signal (rocs) by N to generate an output (rocs_by_N), where N is an integer. The output (rosc_reg_out) is provided by a latch and serially provides the content of the multiple latches within the word line pulse width monitor 246. By providing the outputs (rosc_reg_out and rocs_by_N), the word line pulse width monitor 246 is configured to determine a pulse width of the word select signal (wl).

During operation, the circuit 200 may be used to characterize the sense amplifier 104 and to determine a test code that may substantially compensate for a voltage offset of the sense amplifier 104. In another operation, the circuit 200 may be used to provide the offset compensation code 252 to the plurality of latches to substantially compensate for the voltage offset of the sense amplifier 104 (e.g. during a memory operation). In addition, the circuit 200 may used to characterize the bit cell 102.

To characterize the sense amplifier 104, the bit cell 102 is isolated from the sense amplifier 104 by operation of the first and second decoupling transistors 234, 236. After isolating the bit cell 102, the first and second sense line precharge devices 230 and 232 may be enabled to precharge the first segments 218, 220 to a precharge voltage. The testing circuit 248 may apply a series of test codes to the plurality of latches 208, such as by conducting a sweep operation of test codes that are scanned in to the latches in the sweep operation. The sweep operation may be conducted with the sense amplifier 104 isolated from the bit cell 102 as indicated. After a particular test code of the series of test codes is loaded into the plurality of latches 208, a determination may be made whether the output 228 of the sense amplifier 104 has toggled in response to the particular test code being stored into the plurality of latches 208. In response to determining at the output monitor 254 that the output 228 of the sense amplifier 104 has toggled (i.e., transitioned from a first state to a second state), the output monitor 254 may generate an output indicating that the particular test code has resulted in the toggling of the output of the sense amplifier 104. The particular test code or a code derived from the particular test code may be stored in the offset compensation code storage 250. For example, the testing circuit 248 may provide the particular test code or a test code derived from the particular test code to the offset compensation code storage 250 to be stored as the offset compensation code 252.

In another embodiment, an offset of the sense amplifier 104 with bit line leakage may be measured. A sweep operation may be performed while the decoupling transistors 234, 236 electrically couple the first segments 218, 220 to the second segments 242, 244, respectively, with all bit cells unselected (e.g. a low voltage is applied to all word lines). To illustrate, the second segments 242, 244 may provide an electrical path between the decoupling transistors 234, 236 and a column of bit cells that include the representative bit cell 102. Each bit cell in the column of bit cells may be selectively coupled to the second segments 242, 244 via access transistors that are responsive to a signal (e.g. a voltage) at a corresponding word line, such as the representative word line 256 that corresponds to the representative bit cell 102. A sweep operation may be conducted while the bit cell portions of the bit lines 114, 116 (i.e. the second segments 242, 244, respectively) are coupled to the sense amplifier portions of the bit lines 114, 116 (i.e. the first segments 218, 220, respectively). In response to determining at the output monitor 254 that the output 228 of the sense amplifier 104 has toggled (i.e., transitioned from a first state to a second state), the output monitor 254 may generate an output indicating that the particular test code has resulted in the toggling of the output of the sense amplifier 104. The particular test code may correspond to a measurement of sense amplifier offset including an effect of bit line leakage. The particular test code (or a code derived from the particular test code) may be stored as the offset compensation code 252 in the offset compensation code storage 250.

In addition to characterizing the sense amplifier 104 and determining an offset compensation code 252, during a memory operation, the circuit 200 may operate to load the offset compensation code 252 into the plurality of latches 208 to substantially compensate for a voltage offset of the sense amplifier 104. A differential charge from a set of the plurality of capacitors (e.g., the set 140 of the plurality of capacitors 106 of FIG. 1) is applied to the first bit line 114 and to the second bit line 116 during a memory operation to compensate for a measured offset of the sense amplifier 104. The set of the plurality of capacitors may be determined based on the offset compensation code 252 that is loaded from the offset compensation code storage 250. For example, the offset compensation code 252 may be loaded from the offset compensation code storage 250 to the plurality of latches 208 via a scan chain. During a memory read operation, such as a memory read operation on the bit cell 102, the offset compensation code 252 may be loaded into the plurality of latches 208 from the offset compensation code storage 250. The offset compensation code 252 that is loaded into the plurality of latches 208 may substantially compensate for the voltage offset of the sense amplifier 104. The offset compensation code 252 that is loaded into the plurality of latches 208 may remain stored in the plurality of the latches independent of an output of the sense amplifier 104. Because the offset compensation code 252 that is loaded into the plurality of latches 208 substantially compensates for the voltage offset of the sense amplifier 104, the sense amplifier 104 may detect a voltage difference between the first bit line 114 and the second bit line 116 faster than a sense amplifier that does not have offset compensation. As a result of a faster detection of a voltage difference, the sense amplifier 104 may more quickly generate an output corresponding to the voltage difference between the first bit line 114 and the second bit line 116 that is indicative of a data value stored in the bit cell 102.

In another embodiment, the differential charge from the capacitors (e.g., the set 140 of the plurality of capacitors 106 of FIG. 1) that is applied to the first bit line 114 and to the second bit line 116 during a memory operation includes a first component corresponding to the measured offset of the sense amplifier 104 and also includes a second component corresponding to a precharge level reduction. For example, the second component may be configured to increase read stability by reducing a first precharge level of the first bit line 114 and reducing a second precharge level of the second bit line 116.

To illustrate, in an example where the sense amplifier 104 has an offset of approximately 20 millivolts (mV), a precharge level of the bit lines 114, 116 is 1.0 volts (V), and read stability is improved at 0.95V as compared to the precharge level, the offset compensation code 252 that is loaded into the plurality of latches 208 may cause the first group of capacitors 212 to reduce a voltage of the first bit line 114 from a first precharge level of 1.0V to 0.95V and to reduce a voltage of the second bit line 116 from a second precharge level of 1.0V to 0.93V. The differential charge resulting from the offset compensation code 252 would include a first component (i.e. 0.02V) applied to the second bit line 116 to compensate for the sense amplifier offset and a second component (i.e. 0.05V) applied to both bit lines 114, 116 to improve read stability. The offset compensation code 252 may be generated by performing a voltage sweep to determine a code that compensates for the offset of the sense amplifier 104 and adjusting the determined code to include one or more additional capacitors of the first group 212 and the second group 214 to increase read stability by reducing a charge to the bit lines 114, 116.

In addition to characterizing the sense amplifier 104 and applying an offset compensation code 252 to substantially compensate for a voltage offset of the sense amplifier 104, the circuit 200 may operate to characterize the bit cell 102. To characterize the bit cell 102, the sense amplifier 104 may be coupled to the bit cell 102. For example, following a characterization of the sense amplifier 104, the decoupling devices 234, 236 may electrically couple the first portions 218, 220 of the first and second bit lines 114, 116 to the second portions 242, 244 of the first and second bit lines 114, 116, respectively. The first and second sense line precharge devices 230, 232, may remain deactivated and the first and second bit line precharge devices 238, 240 may be activated to precharge the first and second bit lines 114 and 116 to a precharge voltage. During a sweep operation to characterize the bit cell 102, the testing circuit 248 may apply a series of test codes to the plurality of latches 208. The word select signal (wl) may pulsed for a pulse width duration for each test code of the series of test codes that is loaded into the plurality of latches 208. The word line pulse width monitor 246 may monitor the word select signal (wl) and may provide outputs (rosc_reg_out and rocs_by_N) that enable determination of a pulse width of the word select signal (wl) 256 that is provided to the bit cell 102.

In addition to determining the pulse width, a voltage difference ($\Delta V$) between the first bit line 114 and the second bit line 116 that triggers the sense amplifier 104 may be determined. The testing circuit 248 may provide a series of test codes to the plurality of latches 208 to determine a particular test code that corresponds to a differential charge that toggles an output of the sense amplifier 104. The differential charge that is applied to the first bit line 114 and the second bit line 116 as a result of the particular test code may correspond to a voltage difference between the first bit line 114 and the second bit line 116 that triggers the sense amplifier 104, resulting in a toggling of an output of the sense amplifier 104. The voltage difference between the first bit line 114 and the second bit line 116 may represent a voltage offset of the first bit line 114 relative to the second bit line 116 that may be used to determine a read current of the bit cell 102.

A read current of the bit cell 102 may be determined based on a voltage offset of the first bit line 114 that triggers the sense amplifier 104, a capacitance of the first bit line 114, and a pulse width of a word select signal (wl) that is provided to the bit cell 102. For example, the read current may be calculated according to a formula Iread=Cbl×($\Delta V/\Delta t$), where Iread is the read current of the bit cell 102, Cbl is capacitance of the first bit line 114, $\Delta V$ is the voltage offset of the first bit line 114 that triggers the sense amplifier 104 toggling an output of the sense amplifier 104, and $\Delta t$ is the pulse width of the word line signal (wl) measured using the world line pulse width monitor 246.

Although FIG. 2 illustrates five latches in each of the first and second groups of latches 202, 204 and five capacitors in each of the first and second groups of latches 212, 214, in other embodiments, the number of latches in the first and second groups of latches 202, 204 and the number capacitors in the first and second groups of capacitors 212, 214 may be greater than or less than 5. In addition, the capacitors may have different capacitance values to enable adjustment of capacitances provided to the first and second bit liens 114, 116 as described with respect to FIG. 3.

By characterizing the sense amplifier 104, the circuit 200 can determine a test code that may substantially compensate for a voltage offset of the sense amplifier 104. By applying a test code, such as the offset compensation code 252, to substantially compensate for a voltage offset of the sense amplifier 104, the sense amplifier 104 may quickly detect a voltage difference between the first bit line 114 and the second bit line 116. In addition, a measured offset voltage of the sense amplifier 104 may be considered in an analysis of the bit cell 102 based on the read current of the bit cell 102. Improved characterization of bit cells, such as the bit cell 102, may result in improvements in the design and manufacturing of bit cells.

Figure 3:
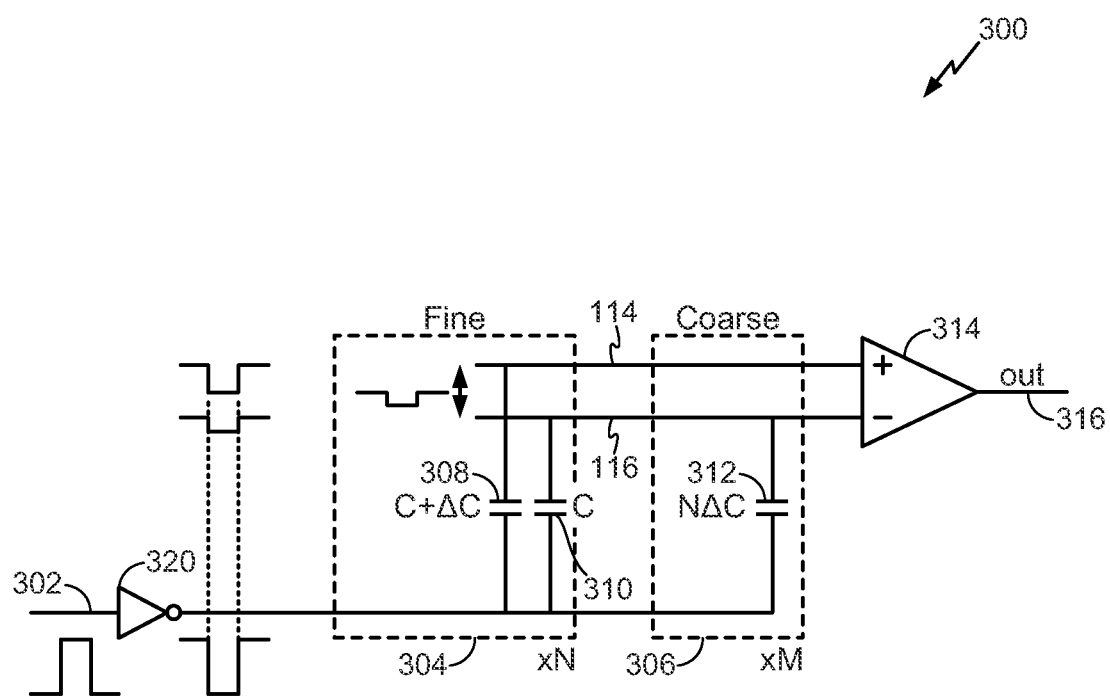
FIG. 3 is a circuit diagram of a particular illustrative embodiment of a plurality of capacitors coupled to a sense amplifier.

Referring to FIG. 3, an illustrative embodiment of a plurality of capacitors coupled to a sense amplifier is depicted and generally designated 300. The system 300 may illustrate operation of the circuit 100 of FIG. 1 or the circuit 200 of FIG. 2 with respect to applying differential charge to the first and second bit lines 114, 116 that are coupled to a sense amplifier 314 (e.g., the sense amplifier 104 of FIGS. 1 and 2). The first bit line 114 is coupled to a first input of the sense amplifier 314, and the second bit line 116 is coupled to a second input of the sense amplifier 314. An input signal 302 is provided to an inverter 320. An output of the inverter 320 is provided to a first set of capacitors 304. For example, the system 300 may include N of the first set of capacitors, where N is an integer, such as 10. The output of the inverter 320 is also provided to a second set of capacitors 306. For example, the system 300 may include M of the second set of capacitors, where M is an integer, such as 6. The second set of capacitors 306 may include one or more capacitors, such as an illustrative capacitor 312 that is coupled to the second bit line 116. The first set of capacitors 304 includes one or more capacitors, such as a first representative capacitor 308 that is coupled to the first bit line 114 and a second representative capacitor 310 that is coupled to the second bit line 116. The sense amplifier 314 generates an output 316 in response to a voltage difference between the first and second bit lines 114, 116.

During operation, the amount of differential charge that is applied to the first and second bit lines 114, 116 may be based on the amount of capacitance that is provided to the first and second bit lines 114, 116. For example, the first set of capacitors 304 may apply a small differential charge to the first and second bit lines 114, 116 as compared to a larger differential charge that may be applied based on the second set of capacitors 306. The amount of capacitance that is provided to the first and second bit lines 114, 116 may be adjusted by performing a course adjustment process and/or a fine adjustment process. In the course adjustment process, the number of the second set of capacitors 306 selectively charged by operation of the input signal 302 may be adjusted until the output 316 of the sense amplifier 314 indicates an expected value in response to a voltage difference between the first bit line 114 and the second bit line 116. Similarly, in the fine adjustment process, the number of the first set of capacitors 304 selectively charged by operation of the input signal 302 may be adjusted until the output 316 of the sense amplifier 314 indicates an expected value in response to a voltage difference between the first bit line 114 and the second bit line 116. In a particular non-limiting example, one of the second set of capacitors 306 may be used instead of a number of the first set of capacitors to provide the same differential charge to the first and second bit lines 114, 116.

In a particular embodiment, a fine adjustment process may be performed by increasing capacitances provided to both the first bit line 114 and to the second bit line 116. To illustrate, the first representative capacitor 308 may have a capacitance approximately equal to C+ΔC, and the second representative capacitor 310 may have a capacitance approximately equal to C. The second representative capacitor 310 may be coupled to the second bit line 116 concurrently with the first representative capacitor 308 being coupled to the first bit line 114. As a result of coupling of capacitors 308, 310 as described, a net increase of capacitance approximately equal to ΔC may be provided to the first bit line 114 by each such pair (e.g., C, C+ΔC) of the first set of capacitors 304. By increasing or decreasing the number of such pairs of the first set of capacitors 304 that are charged by operation of the input signal 302, the amount of differential charge that is applied to the first and second bit lines 114, 116 may be selectively adjusted.

In a particular embodiment, selection of capacitors corresponding to the first set of capacitors 304 and the second set 306 may be performed by providing test codes, such as the test code 110 of FIG. 1, to latches that are coupled to the first and second sets of capacitors 304, 306. For example, the system 300 of FIG. 3 may include the plurality of latches 208 of FIG. 2 coupled to the first and second sets of capacitors 304, 306. The course and fine adjustment operations may be performed by the testing circuit 248 providing a code sweep during a test mode read operation of the bit cell 102 of FIG. 2.

In alternative embodiments, the illustrated coupling of the first and second sets of capacitors 304, 306 to the first and second bit lines 114, 116 may be swapped. For example, the capacitor 308 may be coupled to the second bit line 116 while the capacitors 310, 312 are coupled to the first bit line 114. Further, in another embodiment, the capacitors 308, 312 may be coupled to the same bit line, such as to the first bit line 114 or to the second bit line 116. By incrementing the capacitance provided to the first bit line 114 or the second bit line 116 as described, small increments of differential charges corresponding to small increments of capacitances may be provided to the first and second bit lines 114, 116 in order to characterize the sense amplifier 104 and the bit cell 102 of FIGS. 1 and 2.

Figure 4:
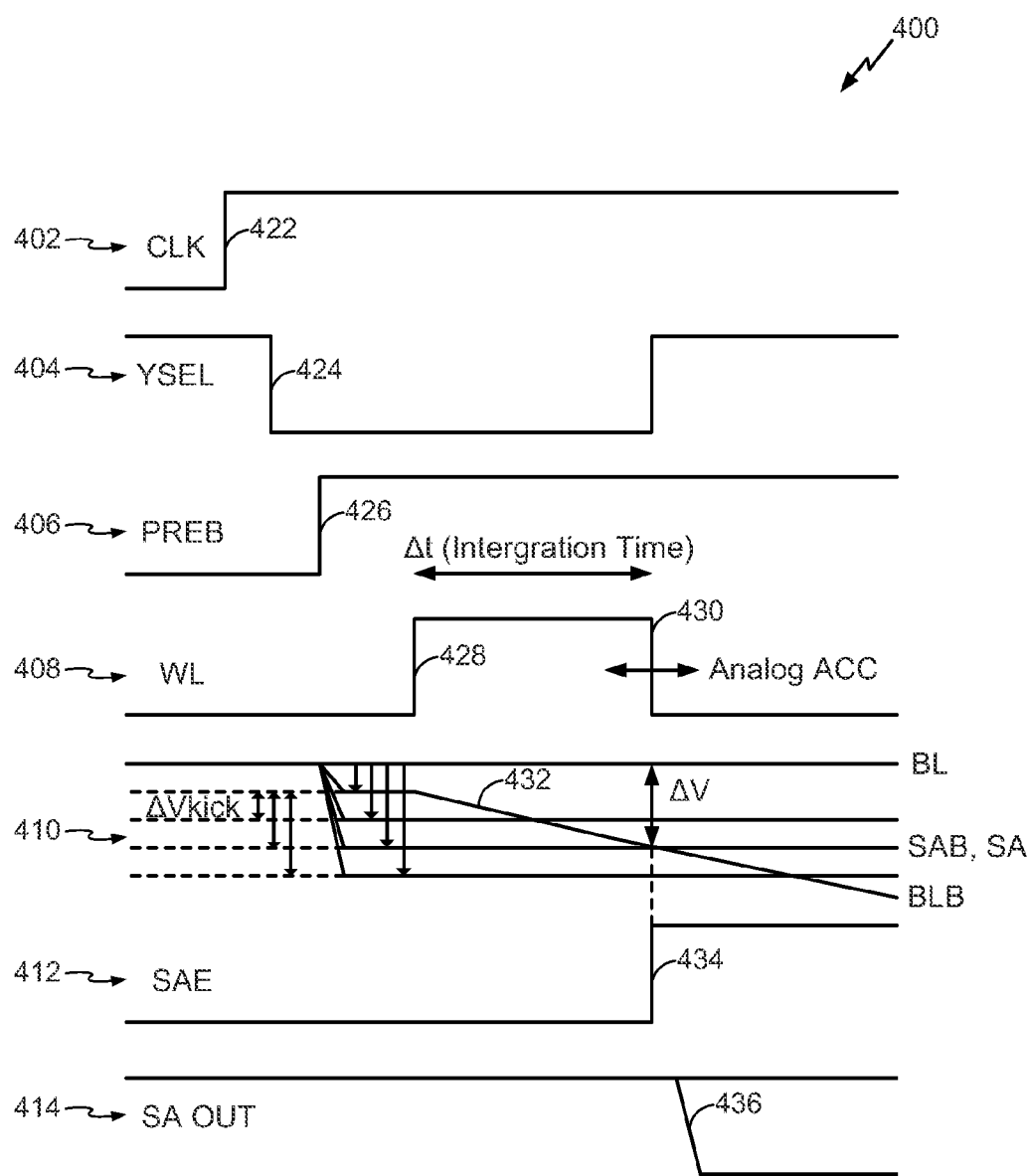
FIG. 4 is a timing diagram illustrating signal traces that may correspond to an operation of the circuit of FIG. 2.

Referring to FIG. 4, a timing diagram illustrating signal traces that may correspond to an operation of the circuit 200 of FIG. 2 to characterize a bit cell, such as the bit cell 102, is depicted and generally designated 400. The diagram 400 includes a clock signal (CLK) 402, a column selection signal (YSEL) 404, a precharge signal (PREB) 406, a word line signal (WL) 408, multiple signals including bit line (BL) (corresponding to the first bit line 114) and bit line bar (BLB) (corresponding to the second bit line 116) indicating multiple iterations of a sweep operation 410, a sense amplifier enable signal (SAE) 412, and a sense amplifier output signal (SA OUT) 414.

The clock signal (CLK) 402 may transition from a low value to a high value at transition 422. The transition 422 may indicate a start of an iteration of a code sweep to characterize a bit cell, such as the bit cell 102 in the circuit 200. The column selection signal (YSEL) 404 transitions from a high state to a low state at transition 424 following the transition 422. At the transition 424, the first segments 218, 220 may be coupled to the second segments 242, 244, respectively, of the bit lines 114, 116 as shown in FIG. 2. The precharge signal (PREB) 406 transitions from a low state to a high state at a transition 426 that follows the transition 424 of the column selection signal (YSEL) 404. The transition 426 may indicate completion of the precharging of the bit lines 114 and 116 by coupling the bit lines 114, 116 to a power source. Following the transition 426 of the precharge signal (PREB) 406, the bit line (BL) and the bit line bar (BLB) exhibit a difference in voltage level. For example, a test code loaded into the plurality of latches 208 of FIG. 2 may result in a differential charge being applied to the bit lines BL and BLB that corresponds to a voltage difference (ΔVkick) between the bit line (BL) and the bit line bar (BLB). Each voltage difference (ΔVkick) shown in the multiple signals 410 may be a result of a corresponding test code that is loaded into the plurality of latches 208 in an iteration of a sweep operation.

After the transition 426, the word line signal (WL) 408 transitions from a low state to a high state at transition 428. In response to the word line signal (WL) transition 428, the bit cell 102 applies voltages corresponding to a stored value to the bit line (BL) and the bit line bar (BLB). As illustrated, the bit cell 102 applies a high voltage to the bit line (BL) and a low voltage to the bit line bar (BLB). In response to the transition 428 and the voltages applied by the bit cell 102 to the bit line (BL) and the bit line bar (BLB), a voltage differential develops at 432 between the bit line (BL) and the bit line bar (BLB). For example, the bit cell 102 may discharge the precharged bit line bar (BLB) while providing a high voltage to the bit line (BL) causing the voltage on bit line bar (BLB) to decrease while the voltage on the bit line (BL) remains substantially the same.

The word line signal (WL) 408 transitions from the high state to the low state at transition 430. Substantially concurrent with the transition 430 of the word line signal (WL) 408, a sense amplifier enable signal (SAE) 412 transitions from a low state to a high state at transition 434 enabling a sense amplifier, such as the sense amplifier 104 of FIG. 2. The enabling of the sense amplifier 104 at the transition 434 initiates a sensing operation by the sense amplifier 104, resulting in a transition 436 of the sense amplifier out (SA OUT) 414.

In response to the bit line bar (BLB) declining for the duration of the word line (WL) pulse between transition 428 and transition 430, a total voltage differential between the bit line (BL) and the bit line bar (BLB) develops as illustrated as ΔV. The sense amplifier, such as the sense amplifier 104 of FIG. 2, has a minimum differential voltage requirement to generate an output signal (SA OUT) 414 indicative of the differential voltage (ΔV) between the bit line (BL) and bit line bar (BLB). To illustrate, if the differential voltage ΔV coinciding with the transition 434 of the sense amplifier enable signal (SAE) 412 meets or exceeds the minimum differential voltage requirement of the sense amplifier 104 to toggle the output signal (SA OUT) 414, the output signal (SA OUT) 414 may toggle at the transition 436. If the differential voltage ΔV at transition 434 of the sense amplifier enable signal (SAE)

412 does not satisfy the minimum differential voltage requirement of the sense amplifier 104 to toggle the output signal (SA OUT) 414, the output signal (SA OUT) 414 may remain unchanged. Because the voltage difference (ΔVkick) between in the bit line (BL) and the bit line bar (BLB) results from the test code loaded into the plurality of latches 208, the differential voltage ΔV coinciding with the transition 434 of the sense amplifier enable signal (SAE) 412 is responsive to the particular test code. By selecting ΔVkick so that ΔV is reached at the transition 434, the bit cell may be characterized using Iread=Cbl×(ΔV/Δt), where Δt corresponds to the duration between transitions 428 and 430.

Figure 5:
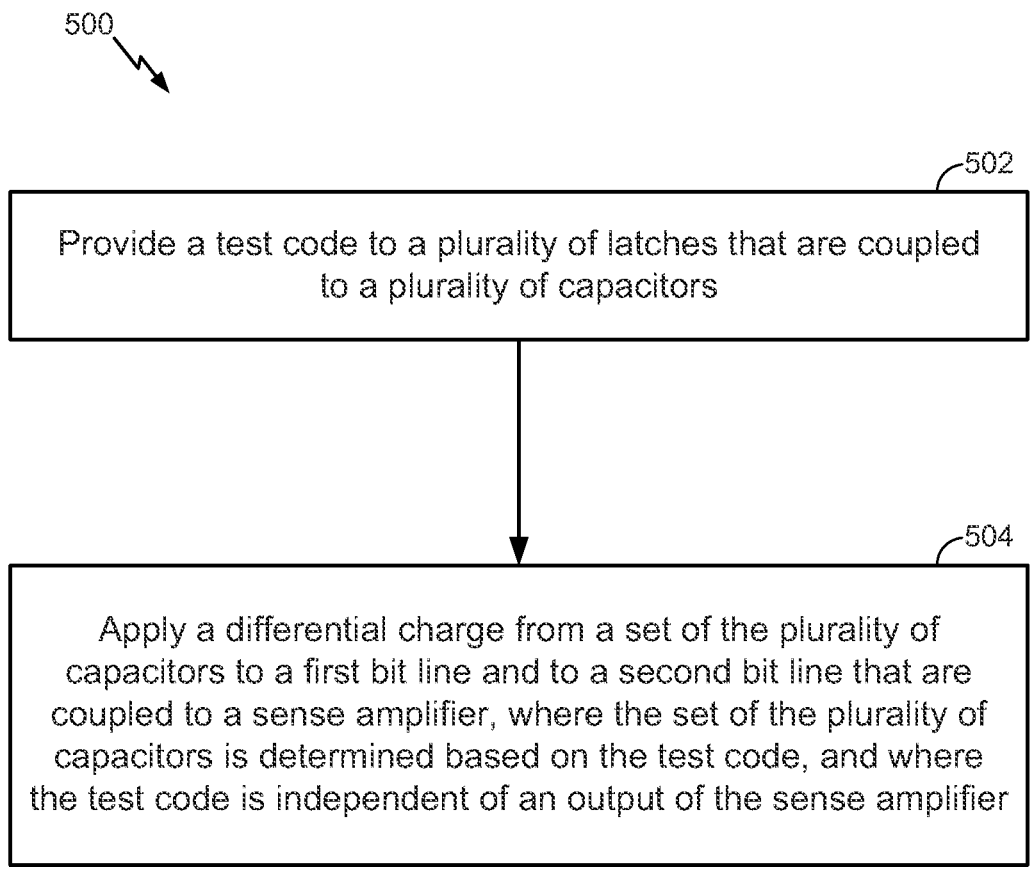
FIG. 5 is a flow chart of a particular illustrative embodiment of a method of operating a characterization and offset compensation circuit, such as either of the circuits of FIGS. 1 and 2.

Referring to FIG. 5, a particular illustrative embodiment of a method of operating a characterization and offset compensation circuit is illustrated. The method 500 includes providing a test code to a plurality of latches that are coupled to a plurality of capacitors, at 502. For example, the test code 110 of FIG. 1 may be provided to the plurality of latches 108. The method 500 further includes applying a differential charge from a set of the plurality of capacitors to a first bit line and to a second bit line that are coupled to a sense amplifier, at 504. To illustrate, the set of the plurality of capacitors 140 may apply a differential charge to the first bit line 114 and to the second bit line 116 of FIG. 1. The first bit line 114 and the second bit line 116 may be coupled to the sense amplifier 104. The set of the plurality of capacitors is determined based on the test code and the test code is independent of an output of the sense amplifier. For example, the set 140 of the plurality of capacitors 106 may be determined based on the test code 110. The test code 110 may be independent of an output of the sense amplifier 104.

In a particular embodiment, a test code, such as the test code 110 of FIG. 1, may be provided to a plurality of latches (e.g., the plurality of latches 108 of FIG. 1) from a code storage, such as the code storage 112 of FIG. 1. For example, the test code may be provided to the plurality of latches by serially shifting the test code into the plurality of latches. The test code may also be provided to the plurality of latches via a scan input, such as when the plurality of latches forms a shift register. In a particular embodiment, an offset compensation code, such as the offset compensation code 252 of FIG. 2, may be determined by sweeping through a plurality of test codes and monitoring an output of the sense amplifier, such as the sense amplifier 104 of FIGS. 1 and 2. Further, a read current of a bit cell may be determined based on a voltage offset of a first bit line that triggers a sense amplifier (e.g., the sense amplifier 104), a capacitance of the first bit line, and a pulse width of a word select signal (e.g., a pulse width of the word select signal (wl) of FIG. 2) that is provided to the bit cell.

The method 500 of FIG. 5 may be implemented by an application-specific integrated circuit (ASIC), a field-programmable gate array (FPGA) device, a processing unit such as a central processing unit (CPU), a digital signal processor (DSP), a controller, another hardware device, a firmware device, or any combination thereof. As an example, the method of FIG. 5 can be performed by or in response to signals or commands from a processor that executes instructions, as described with respect to FIG. 7.

Figure 6:
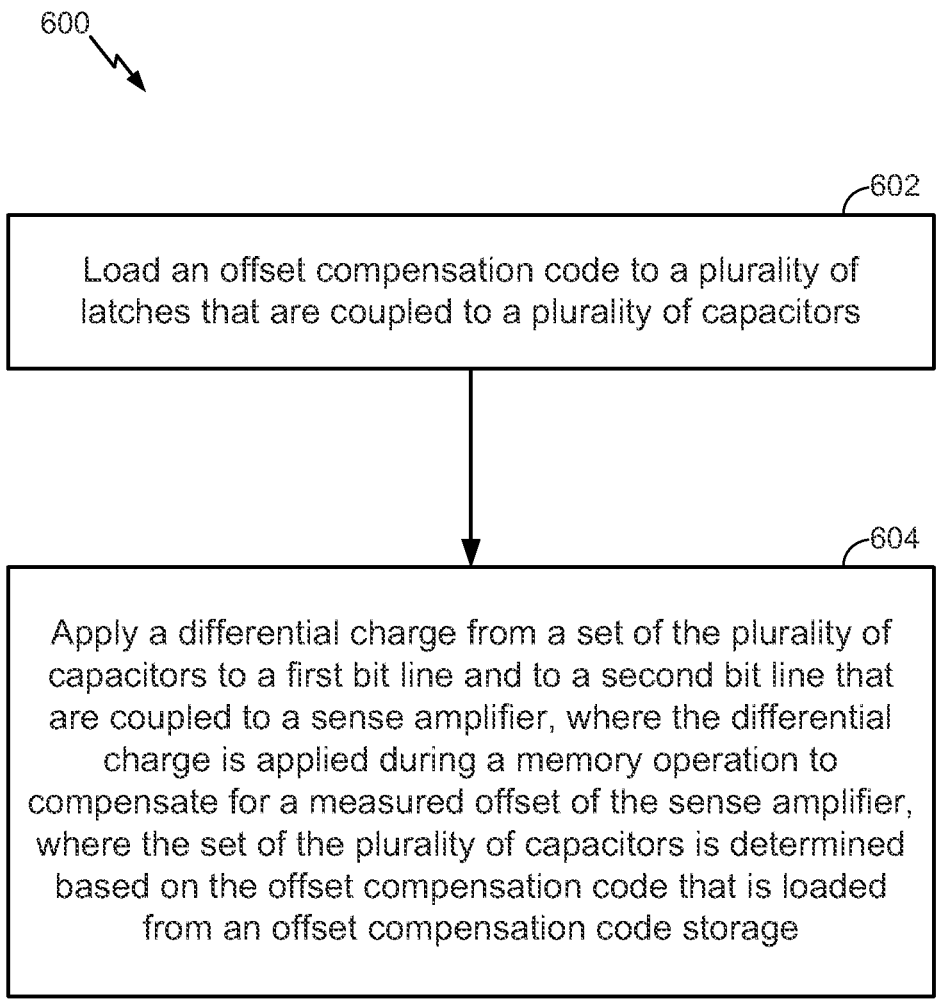
FIG. 6 is a flow chart of a particular illustrative embodiment of a method of operating either of the circuits of FIGS. 1 and 2.

Referring to FIG. 6, a particular illustrative embodiment of a method of operating a sense amplifier voltage offset compensation circuit is illustrated. The method 600 includes loading an offset compensation code into a plurality of latches that are coupled to a plurality of capacitors, at 602. For example, the offset compensation code 252 may be loaded into the plurality of latches 208 that are coupled to the plurality of capacitors 212, 214 of FIG. 2. The method 600 further includes applying a differential charge from a set of the plurality of capacitors to a first bit line and to a second bit line that are coupled to a sense amplifier, at 604.

To illustrate, the set of the plurality of latches 212, 214 may apply a differential charge to the first bit line 114 and to the second bit line 116 of FIG. 2. The first bit line 114 and the second bit line 116 may be coupled to the sense amplifier 104, as shown in FIGS. 1 and 2. The differential charge is applied during a memory operation to compensate for a measured offset of the sense amplifier. The set of the plurality of capacitors is determined based on the offset compensation code that is loaded from a code storage. For example, a differential charge may be applied during a memory operation, such as a memory read operation described with respect to FIG. 2, to compensate for a measured offset of the sense amplifier 104. The set of the plurality of capacitors 212, 214 may be determined based on the offset compensation code 252 that is loaded from a code storage, such as from the code storage 110 of FIG. 1 or from the offset compensation code storage 250 of FIG. 2.

The method 600 of FIG. 6 may be implemented by an application-specific integrated circuit (ASIC), a field-programmable gate array (FPGA) device, a processing unit such as a central processing unit (CPU), a digital signal processor (DSP), a controller, another hardware device, firmware device, or any combination thereof. As an example, the method of FIG. 6 can be performed by or in response to signals or commands from a processor that executes instructions, as described with respect to FIG. 7.

Figure 7:
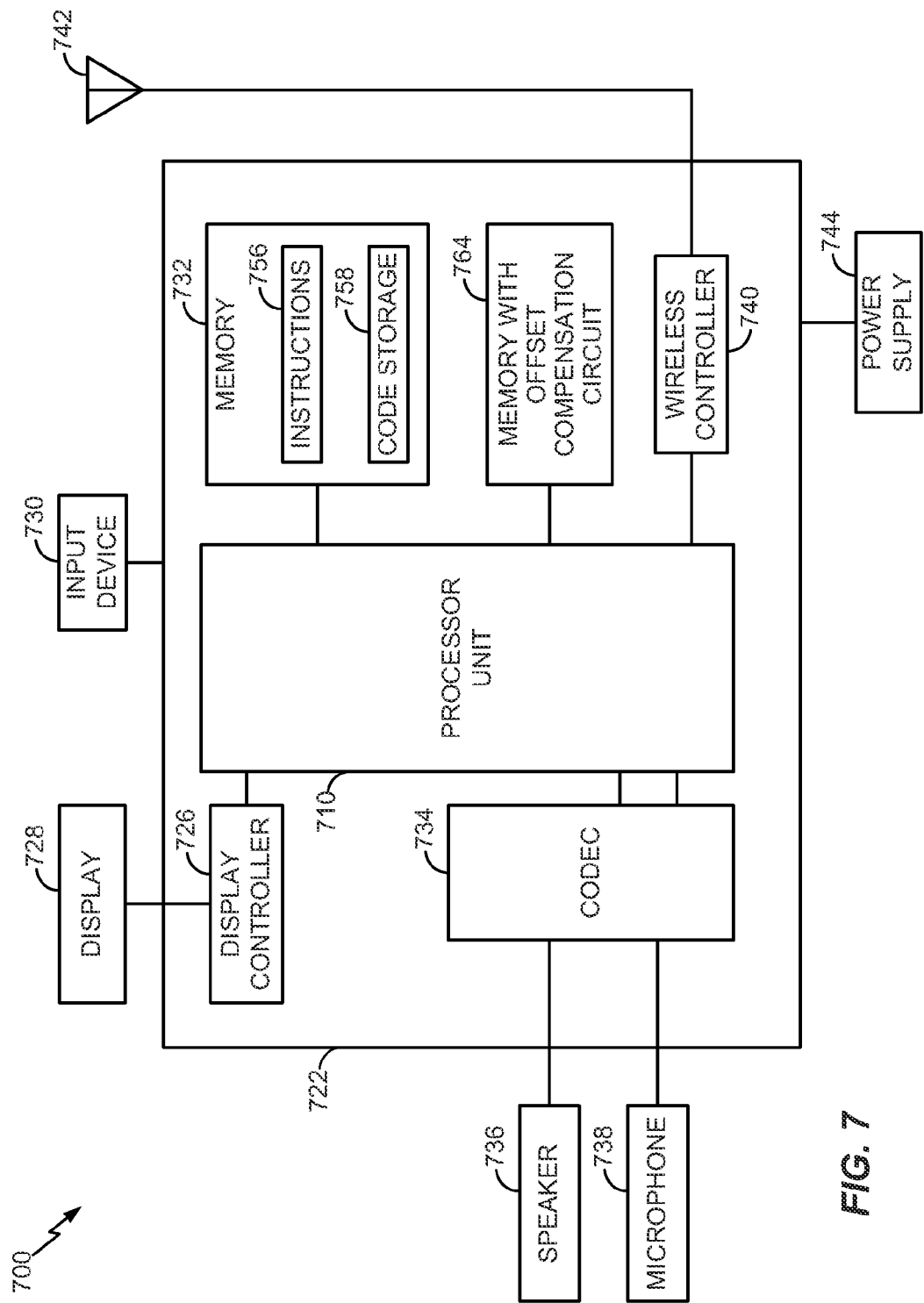
FIG. 7 is a block diagram of wireless device including a memory with an offset compensation circuit.

Referring to FIG. 7, a block diagram of a particular illustrative embodiment of a wireless communication device is depicted and generally designated 700. The wireless communication device 700 includes a processor unit 710, such as a digital signal processor (DSP), coupled to a memory 732. The wireless communication device 700 may include a memory with an offset compensation circuit 764. In an illustrative embodiment, the memory with the offset compensation circuit 764 may correspond to the circuit 100 of FIG. 1 or the circuit 200 of FIG. 2, may operate according to the methods of FIG. 5 or FIG. 6, or any combination thereof.

The memory 732 may be a non-transitory computer readable medium storing computer-executable instructions 756 that are executable by the processor unit 710 (e.g. a computer) to cause the processor unit 710 to provide a test code to a plurality of latches that are coupled to a plurality of capacitors. For example, the computer-executable instructions 756 may include instructions to provide a test code to a plurality of latches that are inside the memory with the offset compensation circuit 764. Additionally, the computer-executable instructions 756 may include instructions that are executable by the processor unit 710 to cause the processor unit 710 to apply a differential charge from a set of the plurality of capacitors to a first bit line and to a second bit line that are coupled to a sense amplifier. For example, the computer-executable instructions 756 may include instructions to assert a signal to enable a set of a plurality of capacitors that are inside the memory with the offset compensation circuit 764 to apply a differential charge from the set of the plurality of capacitors to a first bit line and to a second bit line that are coupled to a sense amplifier that are also inside the memory with the offset compensation circuit 764. The set of the plurality of capacitors may be determined based on the test code, and the test code may be independent of an output of the sense amplifier. In addition, the memory 732 may include a section that is used as a code storage 758 including an offset compensation code storage.

FIG. 7 also shows a display controller 726 that is coupled to the processor unit 710 and to a display 728. A coder/decoder (CODEC) 734 can also be coupled to the processor unit 710. A speaker 736 and a microphone 738 can be coupled to the CODEC 734.

FIG. 7 indicates that a wireless controller 740 can be coupled to the processor unit 710 and to a wireless antenna 742. In a particular embodiment, the processor unit 710, the memory with the offset compensation circuit 764, the display controller 726, the memory 732, the CODEC 734, and the wireless controller 740 are included in a system-in-package or system-on-chip device 722. In a particular embodiment, an input device 730 and a power supply 744 are coupled to the system-on-chip device 722. Moreover, in a particular embodiment, as illustrated in FIG. 7, the display 728, the input device 730, the speaker 736, the microphone 738, the wireless antenna 742, and the power supply 744 are external to the system-on-chip device 722. However, each of the display 728, the input device 730, the speaker 736, the microphone 738, the wireless antenna 742, and the power supply 744 can be coupled to a component of the system-on-chip device 722, such as an interface or a controller.

While FIG. 7 illustrates a particular embodiment of a wireless device 700, one or more memories (e.g., the memory with the offset compensation circuit 764) may be integrated in other electronic devices including a set top box, a music player, a video player, an entertainment unit, a navigation device, a communications device, a personal digital assistant (PDA), a fixed location data unit, and a computer.

In conjunction with the described embodiments, a system is disclosed that may include means for latching a test code, where the means for latching is coupled to a plurality of capacitors. For example, the means for latching may include the plurality of latches 108 of FIG. 1, the latches 208 of FIG. 2, one or more other devices or circuits configured to latch a test code, or any combination thereof. The system may also include means for applying a differential charge to a first bit line and to a second bit line that are coupled to a sense amplifier, where the means for applying the differential charge is determined based on the test code and where the test code is independent of an output of the sense amplifier. The means for applying a differential charge may include the capacitors 106 of FIG. 1, the first group of capacitors 212 and the second group of capacitors 214 of FIG. 2, the first and second groups of capacitors 304 and 306 of FIG. 3, one or more other devices or circuits configured to apply a differential charge to the first bit line and to the second bit line that are coupled to the sense amplifier, or any combination thereof.

Figure 8:
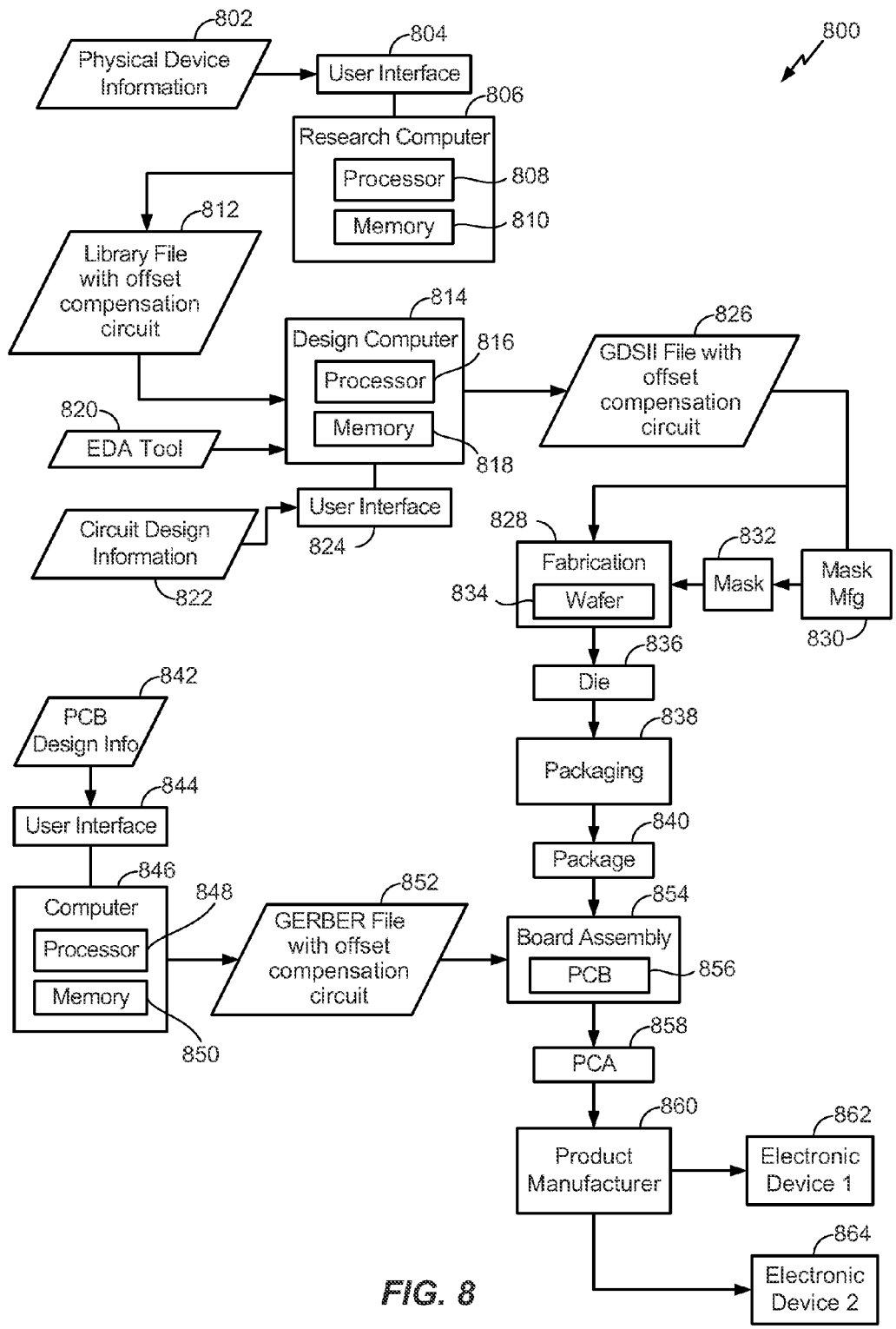
FIG. 8 is a data flow diagram of a particular illustrative embodiment of a manufacturing process to manufacture electronic devices that include a memory with an offset compensation circuit.

The foregoing disclosed devices and functionalities may be designed and configured into computer files (e.g., RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 8 depicts a particular illustrative embodiment of an electronic device manufacturing process 800.

Physical device information 802 is received at the manufacturing process 800, such as at a research computer 806. The physical device information 802 may include design information representing at least one physical property of a semiconductor device, such as a semiconductor device that includes the circuit 100 of FIG. 1, the circuit 200 of FIG. 2, the system of FIG. 3, or any combination thereof. For example, the physical device information 802 may include physical parameters, material characteristics, and structure information that is entered via a user interface 804 coupled to the research computer 806. The research computer 806 includes a processor 808, such as one or more processing cores, coupled to a computer readable medium such as a memory 810. The memory 810 may store computer readable instructions that are executable to cause the processor 808 to transform the physical device information 802 to comply with a file format and to generate a library file 812.

In a particular embodiment, the library file 812 includes at least one data file including the transformed design information. For example, the library file 812 may include a library of semiconductor devices including a device that includes the circuit 100 of FIG. 1, the circuit 200 of FIG. 2, the system 300 of FIG. 3, or any combination thereof, that is provided for use with an electronic design automation (EDA) tool 820.

The library file 812 may be used in conjunction with the EDA tool 820 at a design computer 814 including a processor 816, such as one or more processing cores, coupled to a memory 818. The EDA tool 820 may be stored as processor executable instructions at the memory 818 to enable a user of the design computer 814 to design a circuit including the circuit 100 of FIG. 1, the circuit 200 of FIG. 2, the system 300 of FIG. 3, or any combination thereof, of the library file 812. For example, a user of the design computer 814 may enter circuit design information 822 via a user interface 824 coupled to the design computer 814. The circuit design information 822 may include design information representing at least one physical property of a semiconductor device, such as a device including the circuit 100 of FIG. 1, the circuit 200 of FIG. 2, the system 300 of FIG. 3, or any combination thereof. To illustrate, the circuit design property may include identification of particular circuits and relationships to other elements in a circuit design, positioning information, feature size information, interconnection information, or other information representing a physical property of a semiconductor device.

The design computer 814 may be configured to transform the design information, including the circuit design information 822, to comply with a file format. To illustrate, the file formation may include a database binary file format representing planar geometric shapes, text labels, and other information about a circuit layout in a hierarchical format, such as a Graphic Data System (GDSII) file format. The design computer 814 may be configured to generate a data file including the transformed design information, such as a GDSII file 826 that includes information describing the circuit 100 of FIG. 1, the circuit 200 of FIG. 2, the system 300 of FIG. 3, or any combination thereof, in addition to other circuits or information. To illustrate, the data file may include information corresponding to a system-on-chip (SOC) that includes the circuit 100 of FIG. 1, the circuit 200 of FIG. 2, the system 300 of FIG. 3, and that also includes additional electronic circuits and components within the SOC.

The GDSII file 826 may be received at a fabrication process 828 to manufacture the circuit 100 of FIG. 1, the circuit 200 of FIG. 2, the system 300 of FIG. 3, or any combination thereof, according to transformed information in the GDSII file 826. For example, a device manufacture process may include providing the GDSII file 826 to a mask manufacturer 830 to create one or more masks, such as masks to be used with photolithography processing, illustrated as a representative mask 832. The mask 832 may be used during the fabrication process to generate one or more wafers 834, which may be tested and separated into dies, such as a representative die 836. The die 836 includes circuits that include the circuit 100 of FIG. 1, the circuit 200 of FIG. 2, the system 300 of FIG. 3, or any combination thereof.

The die 836 may be provided to a packaging process 838 where the die 836 is incorporated into a representative package 840. For example, the package 840 may include the single die 836 or multiple dies, such as a system-in-package (SiP) arrangement. The package 840 may be configured to conform to one or more standards or specifications, such as Joint Electron Device Engineering Council (JEDEC) standards.

Information regarding the package 840 may be distributed to various product designers, such as via a component library stored at a computer 846. The computer 846 may include a processor 848, such as one or more processing cores, coupled to a memory 850. A printed circuit board (PCB) tool may be stored as processor executable instructions at the memory 850 to process PCB design information 842 received from a user of the computer 846 via a user interface 844. The PCB design information 842 may include physical positioning information of a packaged semiconductor device on a circuit board, the packaged semiconductor device corresponding to the package 840 including the circuit 100 of FIG. 1, the circuit 200 of FIG. 2, the system 300 of FIG. 3, or any combination thereof.

The computer 846 may be configured to transform the PCB design information 842 to generate a data file, such as a GERBER file 852 with data that includes physical positioning information of a packaged semiconductor device on a circuit board, as well as layout of electrical connections such as traces and vias, where the packaged semiconductor device corresponds to the package 840 including the circuit 100 of FIG. 1, the circuit 200 of FIG. 2, the system 300 of FIG. 3, or any combination thereof. In other embodiments, the data file generated by the transformed PCB design information may have a format other than a GERBER format.

The GERBER file 852 may be received at a board assembly process 854 and used to create PCBs, such as a representative PCB 856, manufactured in accordance with the design information stored within the GERBER file 852. For example, the GERBER file 852 may be uploaded to one or more machines to perform various steps of a PCB production process. The PCB 856 may be populated with electronic components including the package 840 to form a representative printed circuit assembly (PCA) 858.

The PCA 858 may be received at a product manufacture process 860 and integrated into one or more electronic devices, such as a first representative electronic device 862 and a second representative electronic device 864. As an illustrative, non-limiting example, the first representative electronic device 862, the second representative electronic device 864, or both, may be selected from the group of a set top box, a music player, a video player, an entertainment unit, a navigation device, a communications device, a personal digital assistant (PDA), a fixed location data unit, and a computer, into which the circuit 100 of FIG. 1, the circuit 200 of FIG. 2, the system 300 of FIG. 3, or any combination thereof is integrated. As another illustrative, non-limiting example, one or more of the electronic devices 862 and 864 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 8 illustrates remote units according to teachings of the disclosure, the disclosure is not limited to these illustrated units. Embodiments of the disclosure may be suitably employed in any device that includes active integrated circuitry including memory and on-chip circuitry.

A device that includes the circuit 100 of FIG. 1, the circuit 200 of FIG. 2, the system 300 of FIG. 3, or any combination thereof, may be fabricated, processed, and incorporated into an electronic device, as described in the illustrative process 800. One or more aspects of the embodiments disclosed with respect to FIGS. 1-7 may be included at various processing stages, such as within the library file 812, the GDSII file 826, and the GERBER file 852, as well as stored at the memory 810 of the research computer 806, the memory 818 of the design computer 814, the memory 850 of the computer 846, the memory of one or more other computers or processors (not shown) used at the various stages, such as at the board assembly process 854, and also incorporated into one or more other physical embodiments such as the mask 832, the die 836, the package 840, the PCA 858, other products such as prototype circuits or devices (not shown), or any combination thereof. Although various representative stages of production from a physical device design to a final product are depicted, in other embodiments fewer stages may be used or additional stages may be included. Similarly, the process 800 may be performed by a single entity or by one or more entities performing various stages of the process 800.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A circuit comprising:
    a plurality of capacitors responsive to a plurality of latches that store a test code;
    a first bit line coupled to a bit cell and coupled to a sense amplifier; and
    a second bit line coupled to the bit cell and coupled to the sense amplifier, wherein a differential charge from a set of the plurality of capacitors is applied to the first bit line and to the second bit line, wherein the set of the plurality of capacitors is determined based on the test code, and wherein the test code is independent of an output of the sense amplifier.

2. The circuit of claim 1, wherein the test code comprises one values and zero values, wherein each of the one values triggers charging of a capacitor of the plurality of capacitors.

3. The circuit of claim 1, further comprising a testing circuit configured to provide a series of test codes to the plurality of latches to determine a characteristic of the sense amplifier.

4. The circuit of claim 1, wherein the test code is programmable to enable a sweep operation and wherein the sweep operation includes determining when the sense amplifier changes a state in response to a change in the test code.

5. The circuit of claim 4, wherein conducting the sweep operation includes recording the test code in response to determining that the sense amplifier changes state.

6. The circuit of claim 4, wherein the sweep operation is conducted with the sense amplifier isolated from the bit cell.

7. The circuit of claim 4, wherein the sweep operation is conducted with the sense amplifier electrically coupled to the bit cell.

8. The circuit of claim 1, wherein the differential charge from the set of the plurality of capacitors is applied to the first bit line and to the second bit line during a memory operation.

9. The circuit of claim 8, wherein the memory operation is a test mode read operation.

10. The circuit of claim 8, wherein the memory operation is a functional mode read operation.

11. The circuit of claim 1, wherein a read current of the bit cell is determined based on a voltage offset of the first bit line that triggers the sense amplifier, a capacitance of the first bit line, and a pulse width of a word select signal that is provided to the bit cell.

12. The circuit of claim 1 integrated in at least one semiconductor die.

13. The circuit of claim 1, further comprising a device selected from the group consisting of a set top box, a music player, a video player, an entertainment unit, a navigation device, a communications device, a personal digital assistant (PDA), a fixed location data unit, and a computer, into which the sense amplifier is integrated.

14. A method comprising:
    providing a test code to a plurality of latches that are coupled to a plurality of capacitors; and
    applying a differential charge from a set of the plurality of capacitors to a first bit line and to a second bit line that are coupled to a sense amplifier, wherein the set of the plurality of capacitors is determined based on the test code, and wherein the test code is independent of an output of the sense amplifier.

15. The method of claim 14, wherein the test code is provided to the plurality of latches from a code storage.

16. The method of claim 15, wherein the test code is provided to the plurality of latches by serially shifting the test code into the plurality of latches.

17. The method of claim 14, wherein the test code is provided to the plurality of latches via a scan input.

18. The method of claim 14, wherein an offset compensation code is determined by sweeping through a plurality of test codes and monitoring an output of the sense amplifier.

19. The method of claim 18, wherein the offset compensation code corresponds to a sense amplifier offset including an effect of bit line leakage and is determined by sweeping through the plurality of test codes while a sense amplifier portion of the first bit line is coupled to a bit cell portion of the first bit line and while a sense amplifier portion of the second bit line is coupled to a bit cell portion of the second bit line.

20. The method of claim 14, wherein providing the test code to the plurality of latches is performed by a processor integrated into an electronic device.

21. An apparatus comprising:
    means for latching a test code, wherein the means for latching is coupled to a plurality of capacitors; and
    means for applying a differential charge to a first bit line and to a second bit line that are coupled to a sense amplifier, wherein the differential charge is determined based on the test code and wherein the test code is independent of an output of the sense amplifier.

22. The apparatus of claim 21, further comprises means for determining an offset compensation code by sweeping through a plurality of test codes and monitoring an output of the sense amplifier.

23. A non-transitory computer readable tangible medium storing instructions executable by a computer, the instructions comprising:
    instructions that are executable by the computer to provide a test code to a plurality of latches that are coupled to a plurality of capacitors; and
    instructions that are executable by the computer to apply a differential charge from a set of the plurality of capacitors to a first bit line and to a second bit line that are coupled to a sense amplifier, wherein the set of the plurality of capacitors is determined based on the test code, and wherein the test code is independent of an output of the sense amplifier.

24. A method comprising:
    a step for providing a test code to a plurality of latches that are coupled to a plurality of capacitors; and
    a step for applying a differential charge from a set of the plurality of capacitors to a first bit line and to a second bit line that are coupled to a sense amplifier, wherein the set of the plurality of capacitors is determined based on the test code, and wherein the test code is independent of an output of the sense amplifier.

25. The method of claim 24, wherein loading the offset compensation code to the plurality of latches is performed at a processor integrated into an electronic device.

26. An apparatus comprising:
    a plurality of capacitors responsive to a plurality of latches;
    an offset compensation code storage configured to provide an offset compensation code to be loaded into the plurality of latches;
    a first bit line coupled to a sense amplifier; and
    a second bit line coupled to the sense amplifier, wherein a differential charge from a set of the plurality of capacitors is applied to the first bit line and to the second bit line during a memory operation to compensate for a measured offset of the sense amplifier, wherein the set of the plurality of capacitors is determined based on the offset compensation code that is loaded from the offset compensation code storage.

27. The apparatus of claim 26, wherein the memory operation is a memory read.

28. The apparatus of claim 26, further comprising a bit cell, wherein the first bit line and the second bit line are coupled to the bit cell, and wherein the sense amplifier is triggered by a voltage difference between the first bit line and the second bit line that indicates a bit value stored in the bit cell.

29. The apparatus of claim 28, wherein a first voltage difference between the first bit line and the second bit line indicates a first bit value, and a second voltage difference between the first bit line and the second bit line indicates a second bit value that is different from the first bit value.

30. The apparatus of claim 26, wherein the offset compensation code is loaded from the offset compensation code storage via a scan chain.

31. The apparatus of claim 26 integrated in at least one semiconductor die.

32. The apparatus of claim 26, further comprising a device selected from the group consisting of a set top box, a music player, a video player, an entertainment unit, a navigation device, a communications device, a personal digital assistant (PDA), a fixed location data unit, and a computer, into which the sense amplifier is integrated.

33. A method comprising:
loading an offset compensation code into a plurality of latches that are coupled to a plurality of capacitors; and
applying a differential charge from a set of the plurality of capacitors to a first bit line and to a second bit line that are coupled to a sense amplifier, wherein the differential charge is applied during a memory operation to compensate for a measured offset of the sense amplifier, and wherein the set of the plurality of capacitors is determined based on the offset compensation code.

34. The method of claim 33, wherein the differential charge includes a first component corresponding to a measured offset of the sense amplifier and includes a second component corresponding to a precharge level reduction, wherein the second component is configured to increase read stability by reducing a first precharge level of the first bit line and a second precharge level of the second bit line.

35. The method of claim 33, further comprising a bit cell, wherein the first bit line and the second bit line are coupled to the bit cell, and wherein the sense amplifier is triggered by a voltage difference between the first bit line and the second bit line that indicates a bit value stored in the bit cell.

36. The method of claim 33, wherein loading the offset compensation code to the plurality of latches is performed at a processor integrated into an electronic device.

37. A circuit comprising:
a plurality of reactance elements;
a first bit line coupled to a bit cell; and
a second bit line coupled to the bit cell, wherein a differential signal from a set of the reactance elements is applied to the first bit line and to the second bit line during a memory read operation based on an offset compensation code that is loaded from an offset compensation code storage into a plurality of latches.

38. The circuit of claim 37 integrated in at least one semiconductor die.

39. The circuit of claim 37, further comprising a device selected from the group consisting of a set top box, a music player, a video player, an entertainment unit, a navigation device, a communications device, a personal digital assistant (PDA), a fixed location data unit, and a computer, into which the bit cell is integrated.

40. A method comprising:
receiving a data file comprising design information corresponding to a semiconductor device; and
fabricating the semiconductor device according to the design information, wherein the semiconductor device comprises:
a plurality of capacitors responsive to a plurality of latches;
an offset compensation code storage configured to provide an offset compensation code to be loaded into the plurality of latches;
a first bit line coupled to a sense amplifier; and
a second bit line coupled to the sense amplifier, wherein a set of the plurality of capacitors is determined based on the offset compensation code.

41. The method of claim 40, wherein the data file has a GDSII format.

42. The method of claim 40, wherein the data file has a GERBER format.

* * * * *